US010671551B1

(12) United States Patent
Shi et al.

(10) Patent No.: US 10,671,551 B1
(45) Date of Patent: Jun. 2, 2020

(54) SELECTIVE DATA LANE INTERFACE MAPPING

(71) Applicant: Intel Corporation, Santa Clara, CA (US)

(72) Inventors: Jiaxiang Shi, Singapore (SG); Vinay Sharma, Singapore (SG); Ingo Volkening, Singapore (SG)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/280,485

(22) Filed: Feb. 20, 2019

(51) Int. Cl.
*G06F 13/00* (2006.01)
*G06F 13/16* (2006.01)
*G11C 29/52* (2006.01)
*G06F 11/10* (2006.01)

(52) U.S. Cl.
CPC ...... *G06F 13/1668* (2013.01); *G06F 11/1068* (2013.01); *G11C 29/52* (2013.01)

(58) Field of Classification Search
CPC .................................................. G06F 13/00
See application file for complete search history.

(56) References Cited

U.S. PATENT DOCUMENTS 9,324,397 B1 * 4/2016 Desai .................. G11C 7/22

* cited by examiner

*Primary Examiner* — Cheng Yuan Tseng
(74) *Attorney, Agent, or Firm* — 2SPL Patent Attorneys

(57) ABSTRACT

Systems, methods, and circuitries adapt a system-on-chip (SoC) for use with different external devices. In one example, an SOC includes a plurality of SoC data lanes configured to conduct data signals between the SoC and an external device interface. The SoC also includes an interface lane adaptor and a device interface including a plurality of interface connectors. The interface lane adaptor circuitry includes a plurality of SoC adaptor connectors connected to the interface connectors; a plurality of external adaptor connectors connected to the SoC data lanes and configured to be connected to the external device interface; a lane selector circuitry configured to connect a selected one of a first or a second SoC adaptor connector to a selected SoC data lane; and a lane configuration circuitry configured to control the lane selector circuitry to connect either the first or the second SoC adaptor connector to the selected SoC data lane.

13 Claims, 7 Drawing Sheets

| Data | 64 Bits | ECC | | |
|---|---|---|---|---|
| mPHY | | | SDRAM | |
| Type | Bits | Data Lane | 64+ECC | 64 |
| | | | DDR3/4 | LPDDR3/4/4x |
| DQ | [7:0] | 0 | DQ[7:0] | DQ[7:0] |
| DQ | [15:8] | 1 | DQ[15:8] | DQ[15:8] |
| DQ | [23:16] | 2 | DQ[23:16] | DQ[23:16] |
| DQ | [31:24] | 3 | DQ[31:24] | DQ[31:24] |
| | | | | |
| AC | [39:0] | | Addr/CMD | Addr/CMD |
| | | | | |
| DQ | [39:32] | 4 | DQ[39:32] | DQ[39:32] |
| DQ | [47:40] | 5 | DQ[47:40] | DQ[47:40] |
| DQ | [55:48] | 6 | DQ[55:48] | DQ[55:48] |
| DQ | [63:56] | 7 | DQ[63:56] | DQ[63:56] |
| DQ | [71:64] | 8 | ECC[7:0] | |

FIG. 4A

| Data | 32 bits | ECC | | | | | | | |
|---|---|---|---|---|---|---|---|---|---|
| mPHY | | | SDRAM | | | | | | |
| Type | Bits | Data Lane | 32+ECC | 32+ECC | 32+ECC | 32+ECC | 32+ECC | 32+ECC | 32+ECC |
| DQ | [7:0] | 0 | DQ[7:0] | | | | ECC[7:0] | | |
| DQ | [15:8] | 1 | DQ[15:8] | | | ECC[7:0] | | ECC[7:0] | |
| DQ | [23:16] | 2 | DQ[23:16] | DQ[7:0] | DQ[7:0] | DQ[7:0] | DQ[7:0] | | |
| DQ | [31:24] | 3 | DQ[31:24] | DQ[15:8] | DQ[15:8] | DQ[15:8] | DQ[15:8] | DQ[7:0] | DQ[7:0] |
| | | | | | | | | | |
| AC | [39:0] | | Addr/CMD | Addr/CMD | Addr/CMD | Addr/CMD | Addr/CMD | Addr/CMD | Addr/CMD |
| | | | | | | | | | |
| DQ | [39:32] | 4 | ECC[7:0] | DQ[23:16] | DQ[23:16] | DQ[23:16] | DQ[23:16] | DQ[15:8] | DQ[15:8] |
| DQ | [47:40] | 5 | | DQ[31:24] | DQ[31:24] | DQ[31:24] | DQ[31:24] | DQ[23:16] | DQ[23:16] |
| DQ | [55:48] | 6 | | ECC[7:0] | | | | DQ[31:24] | DQ[31:24] |
| DQ | [63:56] | 7 | | | ECC[7:0] | | | | ECC[7:0] |
| DQ | [71:64] | 8 | NOT USED | | | | | | |

FIG. 4B

| Data | 32 Bits | | | | | | | | | |
|---|---|---|---|---|---|---|---|---|---|---|
| | mPHY | | SDRAM | | | | | | | |
| Type | Bits | Data Lane | 32 | 32 | 32 | 32 | 32 | 32 | 32 | 32 |
| DQ | [7:0] | 0 | DQ[7:0] | | DQ[7:0] | | DQ[7:0] | | | |
| DQ | [15:8] | 1 | DQ[15:8] | | DQ[15:8] | | | | DQ[7:0] | DQ[7:0] |
| DQ | [23:16] | 2 | DQ[23:16] | | | DQ[7:0] | | DQ[7:0] | DQ[15:8] | DQ[15:8] |
| DQ | [31:24] | 3 | DQ[31:24] | DQ[7:0] | | DQ[15:8] | DQ[15:8] | | DQ[23:16] | DQ[23:16] |
| AC | [39:0] | | Addr/CMD | Addr/CMD | Addr/CMD | Addr/CMD | Addr/CMD | Addr/CMD | Addr/CMD | Addr/CMD |
| DQ | [39:32] | 4 | | DQ[15:8] | DQ[23:16] | | DQ[23:16] | DQ[15:8] | | |
| DQ | [47:40] | 5 | | DQ[23:16] | DQ[31:24] | DQ[23:16] | | DQ[23:16] | DQ[31:24] | |
| DQ | [55:48] | 6 | | DQ[31:24] | | DQ[31:24] | DQ[31:24] | DQ[31:24] | | DQ[31:24] |
| DQ | [63:56] | 7 | NOT USED | | | | | | | |
| DQ | [71:64] | 8 | NOT USED | | | | | | | |

FIG. 4C

| Data | 16 Bits | | | | | | | | |
|---|---|---|---|---|---|---|---|---|---|
| | mPHY | | SDRAM | | | | | | |
| Type | Bits | Data Lane | 16 | 16 | 16 | 16 | 16 | 16 | 16 |
| DQ | [7:0] | 0 | DQ[7:0] | | | | | | |
| DQ | [15:8] | 1 | DQ[15:8] | DQ[7:0] | | | | | DQ[7:0] |
| DQ | [23:16] | 2 | | DQ[15:8] | DQ[7:0] | | | DQ[7:0] | |
| DQ | [31:24] | 3 | | | DQ[15:8] | DQ[7:0] | DQ[7:0] | | |
| AC | [39:0] | | Addr/CMD | Addr/CMD | Addr/CMD | Addr/CMD | Addr/CMD | Addr/CMD | Addr/CMD |
| DQ | [39:32] | 4 | | | | DQ[15:8] | | | |
| DQ | [47:40] | 5 | | | | | DQ[15:8] | | |
| DQ | [55:48] | 6 | | | | | | DQ[15:8] | DQ[15:8] |
| DQ | [63:56] | 7 | NOT USED | | | | | | |
| DQ | [71:64] | 8 | NOT USED | | | | | | |

FIG. 4D

SELECTIVE DATA LANE INTERFACE MAPPING

BACKGROUND

As electronic devices evolve, physical layer (PHY) compatibility between electronic devices on a circuit board often becomes a challenge. For example, if the PHY interface of a first device changes, the PHY interface of a connected second device may no longer properly communicate with the device. In another scenario when a first device is connected to a second device that has multiple versions (e.g., a memory device available with different densities), the PHY interface of the first device may not be compatible with all the different versions of the second device.

BRIEF DESCRIPTION OF THE DRAWINGS

FIGS. 4A-4D illustrate exemplary mappings enabled by interface lane adaptor circuitry in accordance with various aspects described.

DESCRIPTION

Figure 1:
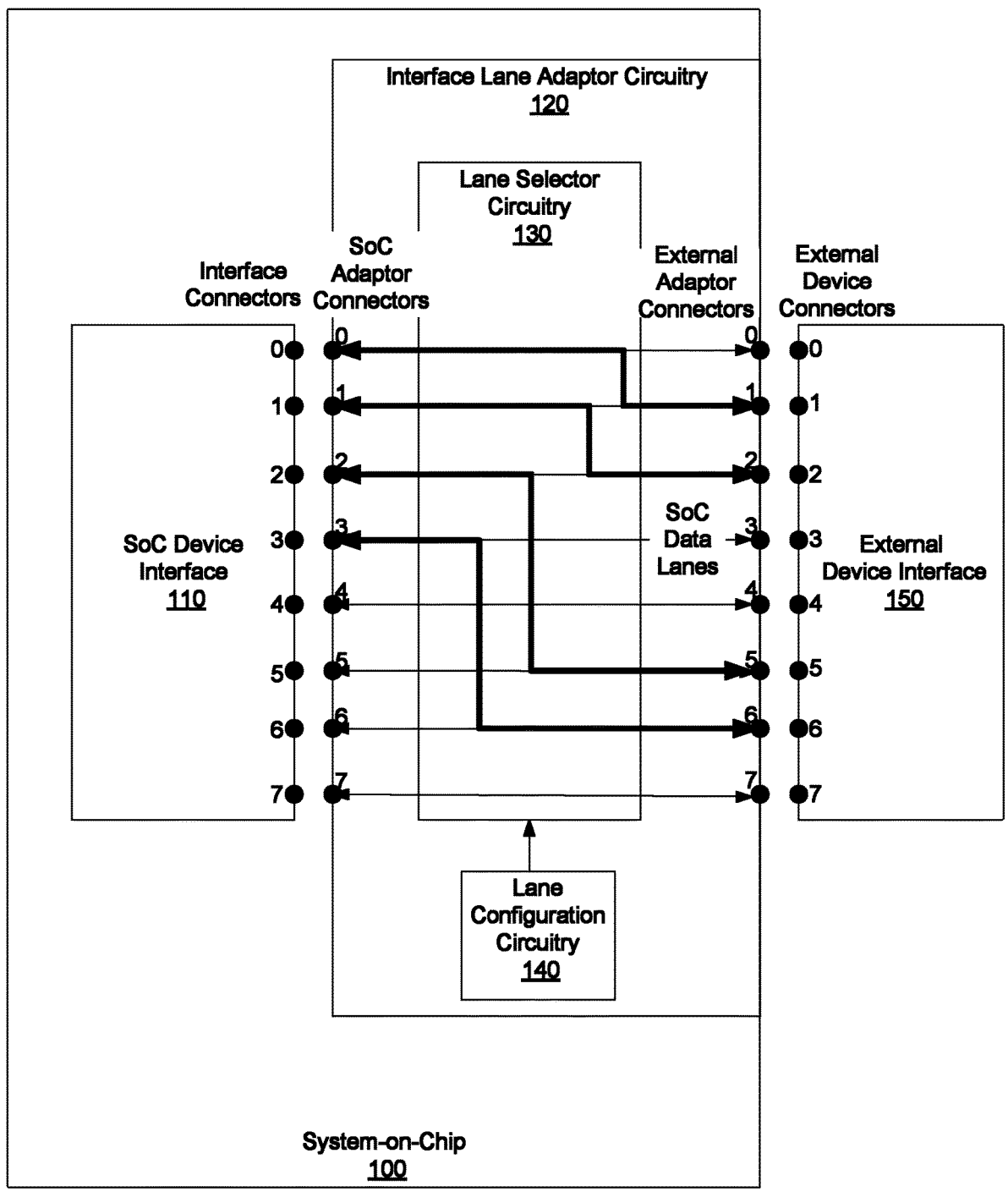
FIG. 1 illustrates an exemplary system-on-chip (SoC) that includes an interface lane adaptor circuitry in accordance with various aspects described.

Many SoCs include a double data rate (DDR) memory controller and provide a controller interface that is designed to be connected to an external DDR memory device. DDR memory devices come in different densities, meaning that they are capable of transferring a different number of bits in parallel. Common DDR memory device densities include 8 bit, 16 bit, 32 bit, and 64 bit. Some DDR memory transfer protocols also include 8 bits of ECC data that is transferred in parallel along with the data bits. Each bit density will include a different number of I/O connectors and the different I/O connectors may be mapped to different byte lanes (e.g., mapped to a different set of eight bits in the data being transferred).

It can be seen that there are many different possible DDR device memory device interfaces to which a given SoC DDR memory controller interface may be connected. In some SoC solutions, a dedicated version of an SoC is produced for each different DDR memory device density. This, of course, complicates the design process and increases costs.

Described herein are circuitry, systems, and methods that allow for adaptive mapping of PHY byte lanes for a device on an SoC (e.g., a DDR memory controller interface) to PHY byte lanes on an external or peripheral device (e.g., a DDR memory device) without disrupting speed of operation or functionality. The adaptive mapping can be performed using SoC configuration software that controls interface lane adaptor circuitry (i.e., hardware) to map each SoC PHY byte lane to a selected external device PHY byte lane.

The adaptive lane mapping circuitry, systems, and methods will, in many instances, be described herein in the context of a DDR memory controller interface on an SoC and an external DDR memory device. However, it is to be understood that the described circuitry, systems, and methods may be used in any application in which it may be advantageous to allow first device to interface with external devices having different PHY interface configurations.

The present disclosure will now be described with reference to the attached figures, wherein like reference numerals are used to refer to like elements throughout, and wherein the illustrated structures and devices are not necessarily drawn to scale. As utilized herein, terms "module", "component," "system," "circuit," "element," "slice," "circuitry," and the like are intended to refer to a set of one or more electronic components, a computer-related entity, hardware, software (e.g., in execution), and/or firmware. For example, circuitry or a similar term can be a processor, a process running on a processor, a controller, an object, an executable, a program, a storage device, and/or a computer with a processing device. By way of illustration, an application running on a server and the server can also be circuitry. One or more circuits can reside within the same circuitry, and circuitry can be localized on one computer and/or distributed between two or more computers. A set of elements or a set of other circuits can be described herein, in which the term "set" can be interpreted as "one or more."

As another example, circuitry or similar term can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, circuitry can be an apparatus that provides specific functionality through electronic components without mechanical parts; the electronic components can include one or more processors therein to execute executable instructions stored in computer readable storage medium and/or firmware that confer(s), at least in part, the functionality of the electronic components.

It will be understood that when an element is referred to as being "connected" or "coupled" to another element, it can be physically connected or coupled to the other element such that current and/or electromagnetic radiation (e.g., a signal) can flow along a conductive path formed by the elements. Intervening conductive, inductive, or capacitive elements may be present between the element and the other element when the elements are described as being coupled or connected to one another. Further, when coupled or connected to one another, one element may be capable of inducing a voltage or current flow or propagation of an electro-magnetic wave in the other element without physical contact or intervening components. Further, when a voltage, current, or signal is referred to as being "applied" to an element, the voltage, current, or signal may be conducted to the element by way of a physical connection or by way of capacitive, electro-magnetic, or inductive coupling that does not involve a physical connection.

As used herein, a signal that is "indicative of" a value or other information may be a digital or analog signal that encodes or otherwise communicates the value or other information in a manner that can be decoded by and/or cause a responsive action in a component receiving the signal. The signal may be stored or buffered in computer readable storage medium prior to its receipt by the receiving component and the receiving component may retrieve the signal from the storage medium. Further, a "value" that is "indicative of" some quantity, state, or parameter may be physically embodied as a digital signal, an analog signal, or stored bits that encode or otherwise communicate the value.

As used herein, a byte lane or PHY byte lane refers to a physical conductive connection (e.g., a conductive trace, layer, wire, and so on) configured to conduct signals indicative of 8 bits of data in parallel. The PHY byte lane is associated with the PHY layer of an SoC. In contrast, a data lane refers to a physical conductive connection configured to conduct signals indicative of data without limitation on the type of data or the number of bits conducted in parallel. Thus, a PHY byte lane is a type of data lane.

As used herein a connector refers to any physical connection means configured to be physically coupled (e.g., mechanically connected or soldered) to another conductive element to create a conductive connection. A connector may be a pin, a socket, a conductive pad, male/female connector, or any other mechanism that can be used to create such a connection.

Use of the word example is intended to present concepts in a concrete fashion. The terminology used herein is for the purpose of describing particular examples only and is not intended to be limiting of examples. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

In the following description, a plurality of details is set forth to provide a more thorough explanation of the embodiments of the present disclosure. However, it will be apparent to one skilled in the art that embodiments of the present disclosure may be practiced without these specific details. In other instances, well-known structures and devices are shown in block diagram form rather than in detail in order to avoid obscuring embodiments of the present disclosure. In addition, features of the different embodiments described hereinafter may be combined with each other, unless specifically noted otherwise.

FIG. 1 illustrates an exemplary SoC 100 that includes an SoC device interface 110 and interface lane adaptor circuitry 120. The device interface 110 includes a plurality of interface connectors (interface connectors 0-7 are illustrated, however, any number may be present) configured to conduct data signals to and from the device interface 110. The SoC 100 communicates (e.g., transfers data) with an external device interface 150 having a plurality of external device connectors (external device connectors 0-7 are illustrated, however, any number may be present). The SoC 100 includes a plurality of SoC data lines that conduct data being transferred between the external device interface 150 and the SoC. In one example, the SoC data lanes are PHY layer byte lanes configured to conduct, in parallel, signals indicative of eight bits of data (which may include ECC data).

In order for the SoC device interface 110 and the external device interface 150 to be compatible, the SoC PHY layer byte lanes must conduct the data bytes in a predetermined configuration that is understood by the external device. For example, when the SoC device interface 110 is a DDR memory controller interface and the external device interface 150 is a DDR memory device interface the data bytes may be placed on PHY byte lanes according to the DDR PHY Interface (DFI) specification or protocol, which is an industry standard that dictates which sets of eight bits are present at which external connectors (e.g., SoC byte lanes).

If the external data device interface 150 is compatible with the SoC device interface 110 (e.g., having the same density), the external device connectors could be connected directly to the interface connectors without the intervening interface lane adaptor circuitry 120. However, as noted above, in some applications, the external device interface may not be compatible with the SoC device interface in this manner. The interface lane adaptor circuitry 120 allows mapping of the SoC data lanes to different SoC adaptor connectors to allow the SoC device interface 110 to be compatible with multiple external device interfaces.

The interface lane adaptor circuitry 120 includes a plurality of SoC adaptor connectors (SoC adaptor connectors 0-7 are illustrated, however, any number of SoC adaptor connectors may be present). The SoC adaptor connectors are connected to the interface connectors. The interface lane adaptor circuitry 120 also includes a plurality of external adaptor connectors configured to be connected to the external device interface connectors (external adaptor connectors 0-7 are illustrated, however, any number of external adaptor connectors may be present). When the SoC 100 is connected to the external device interface 150 the external adaptor connectors connect the SoC data lanes to the external device connectors. In other words, the interface lane adaptor circuitry is configured to be plugged into the SoC interface device 110 and the external device interface 150.

The interface lane adaptor circuitry 120 includes lane selector circuitry 130 and lane configuration circuitry 140. The lane selector circuitry 130 is configured to connect a selected one of a first SoC adaptor connector or a second SoC adaptor connector to one of the SoC data lanes. In FIG. 1, connections provided by the lane selector circuitry are illustrated as lines between the SoC adaptor connectors and the external adaptor connectors. Bold lines indicate a connection that is made in the selected configuration while lighter lines indicate a connection that is not made in the selected configuration. For example it can be seen that the lane selector circuitry 130 provides two possible connections between SoC adaptors and the SoC data lane connected to external adaptor connector 1. Either SoC adaptor connector 0 or SoC adaptor connector 1 can be connected to external adaptor 1.

In the example illustrated in FIG. 1 the lane selector circuitry 130 has been configured to adapt an SoC device interface 110 that transfers data on interface connectors 0-3 (e.g., a DDR memory controller with 32 bit density) to be compatible with an external device interface configured to transfer data on up to eight external device connectors (e.g., a DDR memory device with 64 bit density capability). In this configuration, the lane selector circuitry 130 provides a connection between SoC adaptor connector 0 and the SoC data lane connected to external adaptor connector 1, SoC adaptor connector 1 and the SoC data lane connected to external adaptor connector 2, SoC adaptor connector 2 and the SoC data lane connected to external adaptor connector 5, and SoC adaptor connector 3 and the SoC data lane connected to external adaptor connector 6. In other words, interface connector 0 will be connected to external adaptor connector 1, and so on. In another configuration, the lane selector circuitry 130 connects SoC adaptor connector 0 to the SoC data lane connected to external adaptor connector 0.

The lane configuration circuitry 140 controls the lane selector circuitry 130 to connect a selected SoC adaptor connector with each SoC data lane.

Figure 2A:
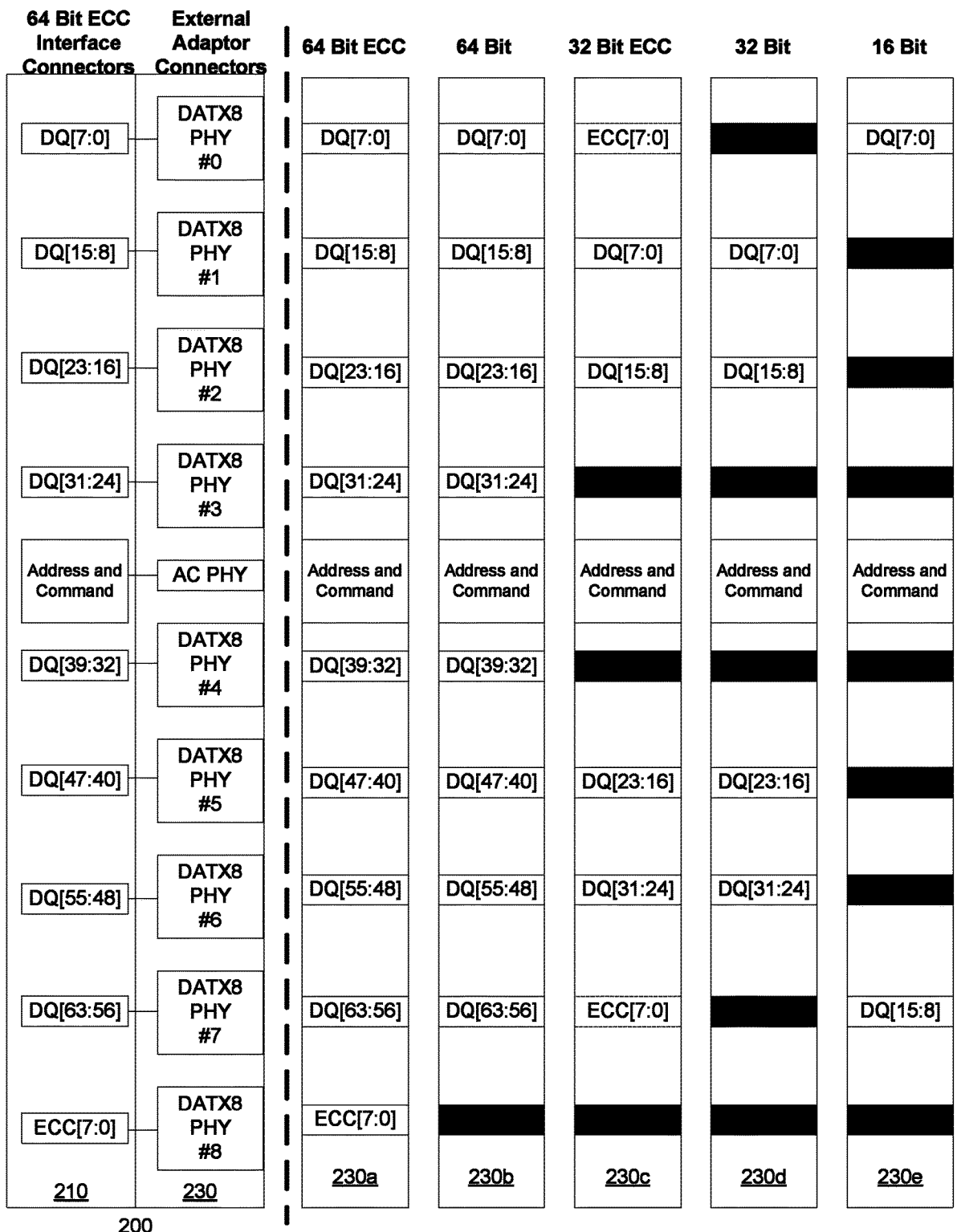
FIG. 2A illustrates an exemplary mapping between a 64 bit with ECC memory controller and various memory device interfaces in accordance with various aspects described.

FIG. 2A schematically illustrates an SoC 200 with a 64 bit ECC memory controller interface 210 with nine interface connectors configured to transfer nine sets of eight bits (DQ[7:0]-ECC[7:0]) in parallel. Lane selector circuitry 230 is capable being configured in five different modes (230a-230e) to route data between the memory controller interface 210 and five different DDR memory device interfaces having different bit densities (labeling each of the modes 230a-230e). The lane selector circuitry 230 is coupled to nine adaptor external adaptor connectors DTX8 PHY #0-DTX8 PHY #8. Each of the external adaptor connectors is configured to transfer a selected set of eight bits between the 64 bit ECC memory controller 210 and a DDR memory device (not shown). The specific set of eight bits transferred by way of each external adaptor connector in each lane selector circuitry mode is shown in the mode blocks 230a-230e.

For example, in mode 230a the lane selector circuitry is configured to connect the 64 bit ECC memory controller interface 210 with a DDR memory device interface also having a density of 64 bits ECC. To provide compatibility between the 64 bit ECC DDR memory controller interface 210 and the 64 bit ECC DDR memory device interface, the lane selector circuitry 230 is configured to route bytes "straight through" between each interface connector and its corresponding external adaptor connector. This is shown by the fact that the sets of bits in the mode 230a match the sets of bits in the corresponding interface connectors.

In mode 230b the lane selector circuitry is configured to connect the 64 bit ECC memory controller interface 210 with a DDR memory device interface having a density of 64 bits but without ECC. To provide compatibility between the 64 bit ECC DDR memory controller interface 210 and the 64 bit ECC DDR memory device interface, the lane selector circuitry 230 is configured to route bytes "straight through" between each interface connector and its corresponding external adaptor connector except that the set of ECC bits is not transferred (no data is transferred on external adaptor connector DATX8 PHY #8). This is shown by the fact that the sets of bits in the mode 230b match the sets of bits in the corresponding interface connectors except that external adaptor connector DATX8 PHY #8 is blacked out.

In mode 230c the lane selector circuitry is configured to connect the 64 bit ECC memory controller interface 210 with a DDR memory device interface having a density of 32 bits ECC. To provide compatibility between the 64 bit ECC DDR memory controller interface 210 and the 32 bit ECC DDR memory device interface, the lane selector circuitry 230 is configured to route bytes from the first four interface connectors (the sets of bits corresponding to the first 32 bits of the 64 bit interface width) and the ninth interface connector (ECC[7:0]) to the external adaptor connectors as shown. In this configuration the data bits are transferred on external adaptor connectors DATX8 PHY #1, DATX8 PHY #2, DATX8 PHY #5, and DATX8 PHY #6. Depending on a particular mode selection either external adaptor connector DATX8 PHY #0 or the external adaptor connector DATX8 PHY #7 will transfer the ECC bits. No data is transferred on external adaptor connectors DATX8 PHY #3, DATX8 PHY #4, or DATX8 PHY #8.

In mode 230d the lane selector circuitry is configured to connect the 64 bit ECC memory controller interface 210 with a DDR memory device interface having a density of 32 bits but without ECC. To provide compatibility between the 64 bit ECC DDR memory controller interface 210 and the 32 bit DDR memory device interface, the lane selector circuitry 230 is configured to route bytes from the first four interface connectors (the sets of bits corresponding to the first 32 bits of the 64 bit interface width) to the external adaptor connectors as shown. In this configuration the data bits are transferred on external adaptor connectors DATX8 PHY #1, DATX8 PHY #2, DATX8 PHY #5, and DATX8 PHY #6. No data is transferred on external adaptor connectors DATX8 PHY #3, DATX8 PHY #4, DATX8 PHY #7, or DATX8 PHY #8.

In mode 230e the lane selector circuitry is configured to connect the 64 bit ECC memory controller interface 210 with a DDR memory device interface having a density of 16 bits without ECC. To provide compatibility between the 64 bit ECC DDR memory controller interface 210 and the 16 bit DDR memory device interface, the lane selector circuitry 230 is configured to route bytes from the first two interface connectors (the sets of bits corresponding to the first 16 bits of the 64 bit interface width) to the external adaptor connectors as shown. In this configuration the data bits are transferred on external adaptor connectors DATX8 PHY #0 and DATX8 PHY #7. No data is transferred on external adaptor connectors DATX8 PHY #1-DATX8 PHY #6 or DATX8 PHY #8.

While FIG. 2A illustrates one particular configuration of the lane selector circuitry 230 for each DDR memory device interface bit density, other configurations are possible in which different sets of eight bits of data are transferred on different external adaptor connectors.

Figure 2B:
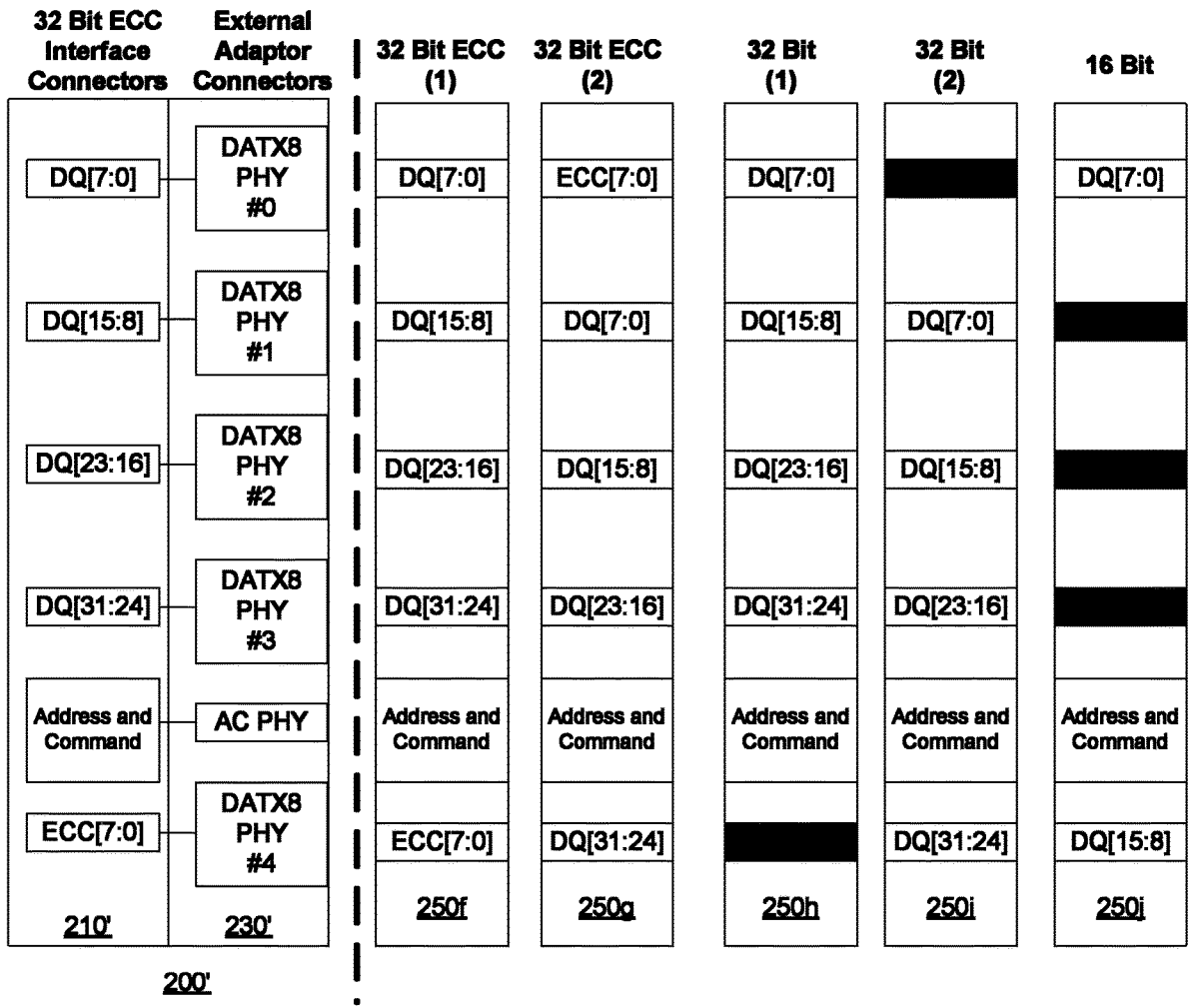
FIG. 2B illustrates an exemplary mapping between a 32 bit with ECC memory controller and various memory device interfaces in accordance with various aspects described.

FIG. 2B schematically illustrates an SoC 200' with a 32 bit ECC memory controller interface 210' with five interface connectors configured to transfer five sets of eight bits (DQ[7:0]-ECC[7:0]) in parallel. Lane selector circuitry 230' is capable being configured in five different modes (230f-230j) to route data between the memory controller interface 210' and DDR memory device interfaces having different bit densities (labeling each of the modes 230f-230j). The lane selector circuitry 230' is coupled to five adaptor external adaptor connectors DTX8 PHY #0-DTX8 PHY #4 Each of the external adaptor connectors is configured to transfer a selected set of eight bits between the 32 bit ECC memory controller 210' and a DDR memory device. The specific set of eight bits transferred by way of each external adaptor connector in each lane selector circuitry mode is shown in the mode blocks 230f-230j.

For example, in mode 230f the lane selector circuitry is configured to connect the 32 bit ECC memory controller interface 210' with a DDR memory device interface also having a density of 32 bits ECC. To provide compatibility between the 32 bit ECC DDR memory controller interface 210' and the 32 bit ECC DDR memory device interface, the lane selector circuitry 230' is configured to route bytes "straight through" between each interface connector and its corresponding external adaptor connector. This is shown by the fact that the sets of bits in the mode 230f match the sets of bits in the corresponding interface connectors.

In mode 230g the lane selector circuitry is configured in an alternative mode to connect the 32 bit ECC memory controller interface 210 with a DDR memory device interface having a density of 32 bits ECC. To provide compatibility between the 32 bit ECC DDR memory controller interface 210' and the 32 bit ECC DDR memory device interface, the data bits are transferred on external adaptor connectors DATX8 PHY #1-DATX PHY #4 and the ECC data bits are transferred on external adaptor connector DATX PHY #0.

In mode 230h the lane selector circuitry is configured to connect the 32 bit ECC memory controller interface 210' with a DDR memory device interface having a density of 32 bits but without ECC. To provide compatibility between the 32 bit ECC DDR memory controller interface 210' and the 32 bit DDR memory device interface, the lane selector circuitry 230' is configured to route bytes from the first four interface connectors (the sets of bits corresponding to the first 32 bits of the 64 bit interface width) to the external adaptor connectors as shown. In this configuration the data bits are transferred on external adaptor connectors DATX8 PHY #0-DATX8 PHY #3. No data is transferred on external adaptor connector DATX8 PHY #4.

In mode 230i the lane selector circuitry is configured in an alternative mode to connect the 32 bit ECC memory controller interface 210' with a DDR memory device interface having a density of 32 bits but without ECC. To provide compatibility between the 32 bit ECC DDR memory controller interface 210' and the 32 bit DDR memory device interface, the data bits are transferred on external adaptor connectors DATX8 PHY #1-DATX PHY #4 and no data is transferred on external adaptor connector DATX PHY #0.

In mode 230j the lane selector circuitry is configured to connect the 32 bit ECC memory controller interface 210' with a DDR memory device interface having a density of 16 bits without ECC. To provide compatibility between the 32 bit ECC DDR memory controller interface 210' and the 16 bit DDR memory device interface, the lane selector circuitry 230' is configured to route bytes from the first two interface connectors (the sets of bits corresponding to the first 16 bits of the 64 bit interface width) to the external adaptor connectors as shown. In this configuration the data bits are transferred on external adaptor connectors DATX8 PHY #0 and DATX8 PHY #4. No data is transferred on external adaptor connectors DATX8 PHY #1-DATX8 PHY #3.

While FIG. 2B illustrates particular configurations of the lane selector circuitry 230 for different DDR memory device interface bit density, other configurations are possible in which different sets of eight bits of data are transferred on different external adaptor connectors.

Figure 3:
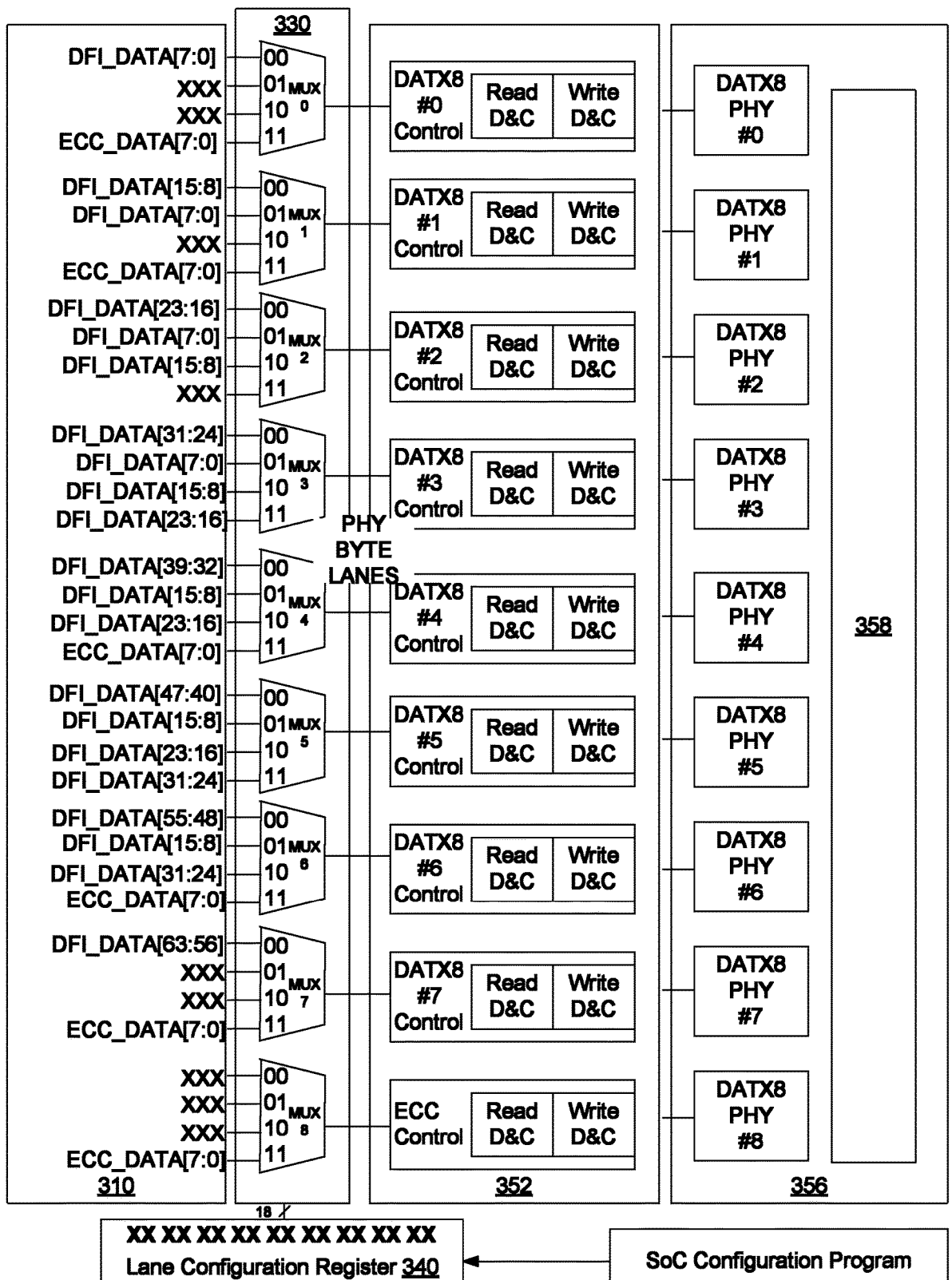
FIG. 3 illustrates an exemplary interface lane adaptor circuitry in accordance with various aspects described.

FIG. 3 illustrates an exemplary lane selector circuitry 330 and lane configuration register 340 connected to a 64 bit ECC DDR memory interface (DDR SDRAM PHY block) 352 for a 64 bit ECC DDR SDRAM 356 having a stub series terminated logic (SSTL) 10 block 358. The DDR memory interface 352 includes nine control blocks DATX8 PHY #0-ECC Control that each connect to PHY byte lanes by way of external connectors on the interface lane adaptor circuitry (not shown in FIG. 3). Each control block controls the transfer (e.g., reading or writing) of eight bits of data. The DDR SDRAM 356 includes PHY inputs DATX8 PHY #0-DATX8 PHY #8 that each transfer eight bits of data to or from the SSTL 10 block 358.

The lane selector circuitry 330 includes nine multiplexers MUX0-MUX8, one for each SoC PHY byte lane. Each of the multiplexers includes four multiplexer inputs (00-11) and a multiplexer output connected to one of the PHY byte lanes. Each multiplexer input is connected to a different interface connector in a 64 bit ECC memory controller interface 310 (indicated by a set of DFI_DATA or ECC_DATA bits corresponding to the sets of bits in FIG. 2A) or a blocking input XXX in which no data is transferred through the multiplexer. For example, MUX 0 is connected at a first input 00 to the interface connector associated with DFI_DATA[7:0] and at its fourth input (11) to the interface connector associated with ECC_DATA[7:0]. The second and third multiplexer inputs are connected to the blocking input XXX.

The lane configuration register 340 stores 18 register bits, two for each of the nine multiplexers. The configuration value stored in each pair of register bits controls the associated multiplexer to pass a signal (e.g., data value) present at one of the multiplexer inputs through to the multiplexer output. In one example, the multiplexers of the lane selector circuitry 330 determine their control value by reading the two bits assigned to the multiplexer in the lane configuration register. In other words, each multiplexer is controlled by a pair of register bits in the lane configuration register. The values for the register bits can be set by an SoC configuration program in execution on a processor to allow a designer to select how the lane configuration circuitry 330 is to route the various sets of data bits to achieve compatibility with different external device interfaces as described in FIGS. 1-2A. Thus the routing of the DDR memory controller interface 310 to the PHY byte lanes of the SoC can be readily manipulated using a simple software tool instead of changing hardware components.

The particular mapping of the interface connectors on the 64 bit ECC memory controller interface 310 to each of the multiplexers MUX0-MUX8 shown in FIG. 3 enable the five configuration modes for the lane selector circuitry illustrated in FIG. 2A. It should be noted that that the mapping shown in FIG. 3 is just one example mapping. Different combinations of interface connectors may be mapped to different multiplexers/SoC PHY byte lanes. Further, the multiplexers may have more than four inputs or less than four inputs. Thus, the lane selector circuitry 330 and the lane configuration register 340 may be configured in any number of ways to support any number of byte lane remappings.

FIG. 4A illustrates an exemplary mapping between a 64 bit ECC DDR memory controller interface and a 64 bit ECC and 64 bit ECC SDRAM. The mPHY Type column indicates the type of data being transferred on a given external adaptor connector (nine data "DQ" external connectors and an access and command (AC) connector are shown). The mPHY Bits column indicates the specific set of eight bits associated with each external adaptor connector. The mPHY Data Lane column indicates which PHY byte lane is associated with the external adaptor connector. The SDRAM 64+ECC column indicates which interface connector (identified by set of bits) is mapped to the particular external connector/PHY byte lane for a 64 bit ECC memory device interface. The SDRAM 64 column indicates which interface connector (identified by set of bits) is mapped to the particular external connector/PHY byte lane for a 64 bit memory device interface.

FIG. 4B illustrates seven alternative mappings between a 64 bit ECC DDR memory controller interface and a 32 bit ECC SDRAM. FIG. 4C illustrates eight alternative mappings between a 64 bit ECC DDR memory controller interface and a 32 bit SDRAM. FIG. 4D illustrates seven alternative mappings between a 64 bit ECC DDR memory controller interface and a 16 bit SDRAM.

Figure 5:
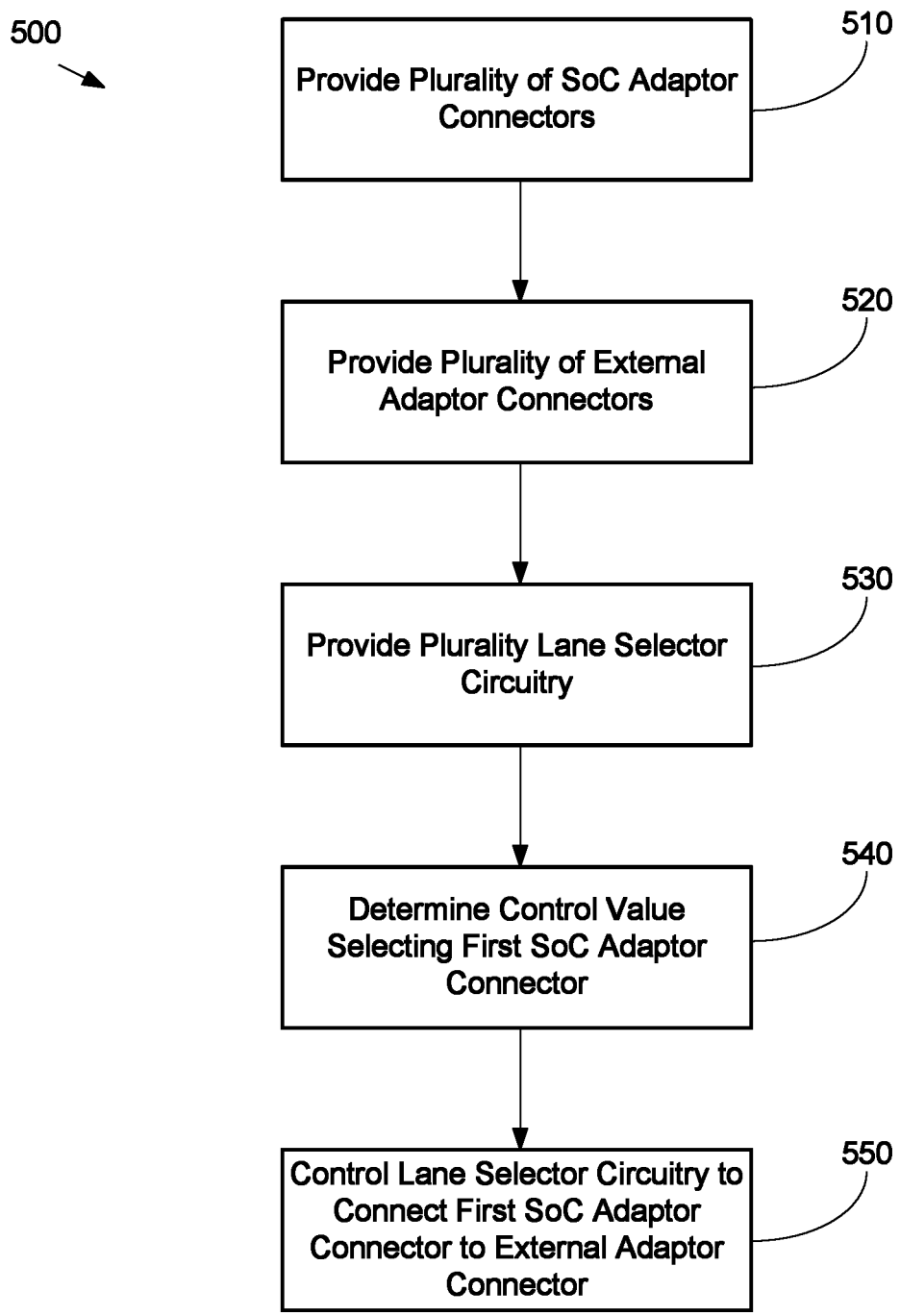
FIG. 5 illustrates an exemplary flow diagram of an exemplary method of adaptively routing data lanes between a memory controller and a memory interface in accordance with various aspects described.

FIG. 5 illustrates a flow diagram outlining an exemplary method for adaptively routing data to PHY data lanes for DDR memory controller interface on an SoC to provide compatibility with a DDR memory interface. The method includes, at 510, providing a plurality of SoC adaptor connectors connected to a double data rate (DDR) memory controller. At 520 a plurality of external adaptor connectors configured to be connected to a DDR memory interface is provided and at 530 a lane selector circuitry configured to connect a selected one of a first SoC adaptor connector or a second SoC adaptor connector to a selected external adaptor connector is provided. The method includes, at 540, determining a control value indicative of a selection of the first SoC adaptor connector; and, at 550, in response, controlling the lane selector circuitry to connect the first SoC adaptor connector to the selected external adaptor connector.

It can be seen from the foregoing description that the methods, circuitries, and systems described herein provide software control of PHY byte lane mappings to support compatibility between an SoC and a number of different external devices having different PHY byte lane mappings.

While the invention has been illustrated and described with respect to one or more implementations, alterations and/or modifications may be made to the illustrated examples without departing from the spirit and scope of the appended claims. In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention.

Examples can include subject matter such as a method, means for performing acts or blocks of the method, at least one machine-readable medium including instructions that, when performed by a machine cause the machine to perform acts of the method or of an apparatus or system for adapting mapping between SoC byte lanes and an external device byte lanes according to embodiments and examples described herein.

Example 1 is a system-on-chip (SoC), including a plurality of SoC data lanes configured to conduct data signals between the SoC and an external device interface. The SoC includes a device interface including a plurality of interface connectors. The SoC includes an interface lane adaptor circuitry. The interface lane adaptor circuitry includes a plurality of SoC adaptor connectors connected to the interface connectors; a plurality of external adaptor connectors connected to the SoC data lanes and configured to be connected to the external device interface; a lane selector circuitry configured to connect a selected one of a first SoC adaptor connector or a second SoC adaptor connector to a selected one of the SoC data lanes; and a lane configuration circuitry configured to control the lane selector circuitry to connect either the first SoC adaptor connector or the second SoC adaptor connector to the selected one of the SoC data lanes.

Example 2 includes the subject matter of example 1, including or omitting optional elements, wherein the device interface is associated with a double data rate (DDR) memory controller; and the SoC data lanes are PHY byte lanes.

Example 3 includes the subject matter of example 1, including or omitting optional elements, wherein the lane selector circuitry includes a multiplexer connected to the first SoC adaptor connector at a first multiplexer input; the second SoC adaptor connector at a second multiplexer input; and the selected one of the SoC data lanes at a multiplexer output.

Example 4 includes the subject matter of example 3, including or omitting optional elements, wherein the lane configuration circuitry includes a register configured to store register bits indicative of a control value for the multiplexer, wherein the control value controls the multiplexer to pass a signal from either the first multiplexer input or the second multiplexer input to the multiplexer output.

Example 5 includes the subject matter of example 4, including or omitting optional elements, wherein the register bits are configured to be set by a configuration program in execution on a processor.

Example 6 includes the subject matter of example 1, including or omitting optional elements, including nine SoC data lanes configured to conduct eight bits of data or eight bits of error correction code (ECC) data. The device interface includes nine SoC interface connectors. The interface lane adaptor circuitry includes nine SoC adaptor connectors connected to the nine interface connectors and nine external adaptor connectors connected to the nine SoC data lanes.

Example 7 includes the subject matter of example 1, including or omitting optional elements, including five SoC data lanes configured to conduct five bits of data or eight bits of error correction code (ECC) data. The device interface includes five SoC interface connectors, The interface lane adaptor circuitry includes five SoC adaptor connectors connected to the five interface connectors and five external adaptor connectors connected to the five SoC data lanes.

Example 8 is an interface lane adaptor circuitry, including a plurality of SoC adaptor connectors; a plurality of external adaptor connectors; a lane selector circuitry configured to connect a selected one of a first SoC adaptor connector or a second SoC adaptor connector to a selected external adaptor connector; and a lane configuration circuitry configured to control the lane selector circuitry to connect either the first SoC adaptor connector or the second SoC adaptor connector to the selected external adaptor connector.

Example 9 includes the subject matter of example 8, including or omitting optional elements, wherein the plurality of SoC adaptor connectors are configured to be connected to interface connectors on a DDR memory controller interface and the plurality of external adaptor connectors are configured to be connected to an external device interface that is associated with a DDR memory device.

Example 10 includes the subject matter of example 8, including or omitting optional elements, wherein the lane selector circuitry includes a multiplexer connected to the first SoC adaptor connector at a first multiplexer input; the second SoC adaptor connector at a second multiplexer input; and the selected external adaptor connector at a multiplexer output.

Example 11 includes the subject matter of example 10, including or omitting optional elements, wherein the lane configuration circuitry includes a register configured to store register bits indicative of a control value for the multiplexer, wherein the control value controls the multiplexer to pass a signal from either the first multiplexer input or the second multiplexer input to the multiplexer output.

Example 12 includes the subject matter of example 11, including or omitting optional elements, wherein the register bits are configured to be set by a configuration program in execution on a processor.

Example 13 is a method, including providing a plurality of SoC adaptor connectors connected to a double data rate (DDR) memory controller; providing a plurality of external adaptor connectors configured to be connected to a DDR memory interface; providing a lane selector circuitry configured to connect a selected one of a first SoC adaptor connector or a second SoC adaptor connector to a selected external adaptor connector; determining a control value indicative of a selection of the first SoC adaptor connector;

and in response, controlling the lane selector circuitry to connect the first SoC adaptor connector to the selected external adaptor connector.

Example 14 includes the subject matter of example 13, including or omitting optional elements, wherein controlling the lane selector circuitry includes controlling a multiplexer that inputs a signal from the first SoC adaptor and a signal from the second SoC adaptor to pass the signal from the first SoC adaptor connector to an SoC data lane connected to the selected external adaptor connector.

Example 15 includes the subject matter of example 13, including or omitting optional elements, wherein determining the control value includes reading a register configured to store register bits indicative of the control value.

Example 16 includes the subject matter of example 15, including or omitting optional elements, wherein the register bits are configured to be set by a configuration program in execution on a processor.

Example 17 is a system-on-chip (SoC), including a double data rate (DDR) memory controller interface including nine interface connectors. The SoC includes nine byte lanes, wherein each byte lane is configured to conduct data signals to and from a DDR memory device interface. The SoC includes an interface lane adaptor circuitry. The interface lane adaptor includes nine SoC adaptor connectors, wherein each SoC adaptor connector is connected to a respective one of the interface connectors and nine external adaptor connectors connected to the nine byte lanes, wherein each external adaptor connector is configured to be connected to a DDR memory device interface. The interface lane adaptor includes a lane selector circuitry, including nine multiplexers, wherein each multiplexer includes a multiplexer output connected to a different byte lane and up to four multiplexer inputs each connected to a different SoC adaptor connector. The interface lane adaptor circuitry includes a lane configuration circuitry including a register configured to store register bits indicative of control values for each of the nine multiplexers, wherein the control value controls the multiplexer to pass a signal from one of the multiplexer inputs to the multiplexer output.

Example 18 includes the subject matter of example 17, including or omitting optional elements, wherein a first SoC adaptor connector is connected to a first interface connector that is configured to conduct a first set of eight data bits of a set of sixty-four bits of data; a second SoC adaptor connector is connected to a second interface connector that is configured to conduct a second set of eight data bits of the set of sixty-four bits of data; a third SoC adaptor connector is connected to a third interface connector that is configured to conduct a third set of eight data bits of the set of sixty-four bits of data; a fourth SoC adaptor connector is connected to a fourth interface connector that is configured to conduct a fourth set of eight data bits of the set of sixty-four bits of data; a firth SoC adaptor connector is connected to a fifth interface connector that is configured to conduct a fifth set of eight data bits of the set of sixty-four bits of data; a sixth SoC adaptor connector is connected to a sixth interface connector that is configured to conduct a sixth set of eight data bits of the set of sixty-four bits of data; a seventh SoC adaptor connector is connected to a seventh interface connector that is configured to conduct a seventh set of eight data bits of the set of sixty-four bits of data; an eighth SoC adaptor connector is connected to an eighth interface connector that is configured to conduct an eighth set of eight data bits of the set of sixty-four bits of data; and a ninth SoC adaptor connector is connected to a ninth interface connector that is configured to conduct a set of eight bits corresponding to an ECC.

Example 19 includes the subject matter of example 18, including or omitting optional elements, wherein a first multiplexer of the nine multiplexers includes a multiplexer output connected to a first external adaptor connector; a first multiplexer input connected to the first SoC adaptor connector; and a second multiplexer input connected to the ninth SoC adaptor connector. A second multiplexer of the nine multiplexers includes a multiplexer output connected to a second external adaptor connector; a first multiplexer input connected to the first SoC adaptor connector; and a second multiplexer input connected to the second SoC adaptor connector; a third multiplexer input connected to the ninth SoC adaptor connector. A third multiplexer of the nine multiplexers includes a multiplexer output connected to a third external adaptor connector; a first multiplexer input connected to the first SoC adaptor connector; a second multiplexer input connected to the second SoC adaptor connector; and a third multiplexer input connected to the third SoC adaptor connector. A fourth multiplexer of the nine multiplexers includes a multiplexer output connected to a fourth external adaptor connector; a first multiplexer input connected to the first SoC adaptor connector; a second multiplexer input connected to the second SoC adaptor connector; a third multiplexer input connected to the third SoC adaptor connector; and a fourth multiplexer input connected to the fourth SoC adaptor connector. A fifth multiplexer of the nine multiplexers includes a multiplexer output connected to a fifth external adaptor connector; a first multiplexer input connected to the second SoC adaptor connector; a second multiplexer input connected to the third SoC adaptor connector; a third multiplexer input connected to a fifth SoC adaptor connector; and a fourth multiplexer input connected to the ninth SoC adaptor connector. A sixth multiplexer of the nine multiplexers includes a multiplexer output connected to a sixth external adaptor connector; a first multiplexer input connected to the second SoC adaptor connector; a second multiplexer input connected to the third SoC adaptor connector; a third multiplexer input connected to the fourth SoC adaptor connector; and a fourth multiplexer input connected to the sixth SoC adaptor connector. A seventh multiplexer of the nine multiplexers includes a multiplexer output connected to a seventh external adaptor connector; a first multiplexer input connected to the second SoC adaptor connector; a second multiplexer input connected to the fourth SoC adaptor connector; a third multiplexer input connected to the seventh SoC adaptor connector; and a fourth multiplexer input connected to the ninth SoC adaptor connector. An eighth multiplexer of the nine multiplexers includes a multiplexer output connected to an eighth external adaptor connector; a first multiplexer input connected to the eighth SoC adaptor connector and a second multiplexer input connected to the ninth SoC adaptor connector. A ninth multiplexer of the nine multiplexers includes a multiplexer output connected to a ninth external adaptor connector and a first multiplexer input connected to the ninth SoC adaptor connector.

Example 20 includes the subject matter of example 17, including or omitting optional elements, wherein the register bits are configured to be set by an SoC configuration program in execution on a processor.

Various illustrative logics, logical blocks, modules, and circuits described in connection with aspects disclosed herein can be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform functions described herein. A general-purpose processor can be a microprocessor, but, in the alternative, processor can be any conventional processor, controller, microcontroller, or state machine. The various illustrative logics, logical blocks, modules, and circuits described in connection with aspects disclosed herein can be implemented or performed with a general purpose processor executing instructions stored in computer readable medium.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize.

In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the disclosure. In addition, while a particular feature may have been disclosed with respect to only one of several implementations, such feature may be combined with one or more other features of the other implementations as may be desired and advantageous for any given or particular application. The use of the phrase "one or more of A, B, or C" is intended to include all combinations of A, B, and C, for example A, A and B, A and B and C, B, and so on.

What is claimed is:

1. A system-on-chip (SoC), comprising:
nine SoC data lanes configured to conduct eight bits of data or eight bits of error correction code (ECC) between the SoC and an external device interface;
a device interface comprising nine SoC interface connectors; and
an interface lane adaptor circuitry, comprising:
nine SoC adaptor connectors connected to the interface connectors;
nine external adaptor connectors connected to the SoC data lanes and configured to be connected to the external device interface;
a lane selector circuitry configured to connect a selected one of a first SoC adaptor connector or a second SoC adaptor connector to a selected one of the SoC data lanes; and
a lane configuration circuitry configured to control the lane selector circuitry to connect either the first SoC adaptor connector or the second SoC adaptor connector to the selected one of the SoC data lanes.

2. The SoC of claim 1, wherein:
the device interface is associated with a double data rate (DDR) memory controller; and
the SoC data lanes are PHY byte lanes.

3. The SoC of claim 1, wherein the lane selector circuitry comprises a multiplexer connected to:
the first SoC adaptor connector at a first multiplexer input;
the second SoC adaptor connector at a second multiplexer input; and
the selected one of the SoC data lanes at a multiplexer output.

4. The SoC of claim 3, wherein the lane configuration circuitry comprises a register configured to store register bits indicative of a control value for the multiplexer, wherein the control value controls the multiplexer to pass a signal from either the first multiplexer input or the second multiplexer input to the multiplexer output.

5. The SoC of claim 4, wherein the register bits are configured to be set by a configuration program in execution on a processor.

6. A system-on-chip (SoC), comprising:
a double data rate (DDR) memory controller interface comprising nine interface connectors;
nine byte lanes, wherein each byte lane is configured to conduct data signals to and from a DDR memory device interface;
an interface lane adaptor circuitry, comprising:
nine SoC adaptor connectors, wherein each SoC adaptor connector is connected to a respective one of the interface connectors, wherein eight of the nine SoC adaptor connectors are each configured to conduct a unique set of eight bits of sixty-four bits of data and one of the nine SoC adaptor connectors is configured to conduct a set of eight bits corresponding to an error correction code (ECC);
nine external adaptor connectors connected to the nine byte lanes, wherein each external adaptor connector is configured to be connected to a DDR memory device interface;
a lane selector circuitry, comprising nine multiplexers, wherein each multiplexer comprises:
a multiplexer output connected to a different byte lane; and
up to four multiplexer inputs each connected to a different SoC adaptor connector; and
a lane configuration circuitry comprising a register configured to store register bits indicative of control values for each of the nine multiplexers, wherein the control value controls the multiplexer to pass a signal from one of the multiplexer inputs to the multiplexer output.

7. The SoC of claim 6, wherein:
a first multiplexer of the nine multiplexers comprises:
a multiplexer output connected to a first external adaptor connector;
a first multiplexer input connected to a first SoC adaptor connector; and
a second multiplexer input connected to a ninth SoC adaptor connector;
a second multiplexer of the nine multiplexers comprises:
a multiplexer output connected to a second external adaptor connector;
a first multiplexer input connected to the first SoC adaptor connector;

a second multiplexer input connected to a second SoC adaptor connector; and
a third multiplexer input connected to the ninth SoC adaptor connector;
a third multiplexer of the nine multiplexers comprises:
a multiplexer output connected to a third external adaptor connector;
a first multiplexer input connected to the first SoC adaptor connector;
a second multiplexer input connected to the second SoC adaptor connector; and
a third multiplexer input connected to a third SoC adaptor connector;
a fourth multiplexer of the nine multiplexers comprises:
a multiplexer output connected to a fourth external adaptor connector;
a first multiplexer input connected to the first SoC adaptor connector;
a second multiplexer input connected to the second SoC adaptor connector;
a third multiplexer input connected to the third SoC adaptor connector; and
a fourth multiplexer input connected to a fourth SoC adaptor connector;
a fifth multiplexer of the nine multiplexers comprises:
a multiplexer output connected to a fifth external adaptor connector;
a first multiplexer input connected to the second SoC adaptor connector;
a second multiplexer input connected to the third SoC adaptor connector;
a third multiplexer input connected to a fifth SoC adaptor connector; and
a fourth multiplexer input connected to the ninth SoC adaptor connector;
a sixth multiplexer of the nine multiplexers comprises:
a multiplexer output connected to a sixth external adaptor connector;
a first multiplexer input connected to the second SoC adaptor connector;
a second multiplexer input connected to the third SoC adaptor connector;
a third multiplexer input connected to the fourth SoC adaptor connector; and
a fourth multiplexer input connected to a sixth SoC adaptor connector;
a seventh multiplexer of the nine multiplexers comprises:
a multiplexer output connected to a seventh external adaptor connector;
a first multiplexer input connected to the second SoC adaptor connector;
a second multiplexer input connected to the fourth SoC adaptor connector;
a third multiplexer input connected to a seventh SoC adaptor connector; and
a fourth multiplexer input connected to the ninth SoC adaptor connector;
an eighth multiplexer of the nine multiplexers comprises:
a multiplexer output connected to an eighth external adaptor connector;
a first multiplexer input connected to a eighth SoC adaptor connector; and
a second multiplexer input connected to the ninth SoC adaptor connector; and
a ninth multiplexer of the nine multiplexers comprises:
a multiplexer output connected to a ninth external adaptor connector; and
a first multiplexer input connected to the ninth SoC adaptor connector.

8. The SoC of claim 6, wherein the register bits are configured to be set by an SoC configuration program in execution on a processor.

9. A system-on-chip (SoC), comprising:
five SoC data lanes configured to conduct eight bits of data or eight bits of error correction code (ECC) between the SoC and an external device interface;
a device interface comprising five SoC interface connectors; and
an interface lane adaptor circuitry, comprising:
five SoC adaptor connectors connected to the interface connectors;
five external adaptor connectors connected to the SoC data lanes and configured to be connected to the external device interface;
a lane selector circuitry configured to connect a selected one of a first SoC adaptor connector or a second SoC adaptor connector to a selected one of the SoC data lanes; and
a lane configuration circuitry configured to control the lane selector circuitry to connect either the first SoC adaptor connector or the second SoC adaptor connector to the selected one of the SoC data lanes.

10. The SoC of claim 9, wherein:
the device interface is associated with a double data rate (DDR) memory controller; and
the SoC data lanes are PHY byte lanes.

11. The SoC of claim 9, wherein the lane selector circuitry comprises a multiplexer connected to:
the first SoC adaptor connector at a first multiplexer input;
the second SoC adaptor connector at a second multiplexer input; and
the selected one of the SoC data lanes at a multiplexer output.

12. The SoC of claim 11, wherein the lane configuration circuitry comprises a register configured to store register bits indicative of a control value for the multiplexer, wherein the control value controls the multiplexer to pass a signal from either the first multiplexer input or the second multiplexer input to the multiplexer output.

13. The SoC of claim 12, wherein the register bits are configured to be set by a configuration program in execution on a processor.

* * * * *